United States Patent [19]
Price, Jr.

[11] Patent Number: 6,107,888
[45] Date of Patent: Aug. 22, 2000

[54] METHOD TO EQUALIZE INPUT CURRENTS TO DIFFERENTIAL-TO-SINGLE-ENDED AMPLIFIER CONFIGURATION

[75] Inventor: John J. Price, Jr., Edina, Minn.

[73] Assignee: VTC Inc., Bloomington, Minn.

[21] Appl. No.: 09/286,890

[22] Filed: Apr. 6, 1999

Related U.S. Application Data

[60] Provisional application No. 60/080,872, Apr. 6, 1998.

[51] Int. Cl.$^7$ ...................................................... H03F 3/04
[52] U.S. Cl. ........................................... 330/301; 330/260
[58] Field of Search ............................... 330/69, 260, 301

[56] References Cited

U.S. PATENT DOCUMENTS

| | | | |
|---|---|---|---|
| 4,779,012 | 10/1988 | Moscovici | 307/353 |
| 4,843,342 | 6/1989 | Hester et al. | 330/257 |
| 5,345,346 | 9/1994 | Brannon et al. | 360/67 |
| 5,757,566 | 5/1998 | Ngo et al. | 360/67 |
| 5,812,019 | 9/1998 | Ngo et al. | 327/538 |
| 5,856,891 | 1/1999 | Ngo | 360/66 |

OTHER PUBLICATIONS

*Analog Filter Design* by M.E. Van Valkenburg, pp. 171–183, ©1982 no month.

*Primary Examiner*—Robert Pascal
*Assistant Examiner*—Henry Choe
*Attorney, Agent, or Firm*—Kinney & Lange, P.A.

[57] ABSTRACT

The present invention is a dual-input-to-single-output amplifier circuit having a processing amplifier, first and second coupling regions, first and second input impedance circuits, first and second feedback impedance circuits, first and second shunting impedance circuits. The processing amplifier has first and second input regions and an output region. The first and the second input regions each exhibit a relatively high circuit impedance. The output region exhibits a relatively low circuit impedance. The processing amplifier is capable of providing at the output region a signal in a first magnitude direction substantially similar to a signal provided at the second input region in the first magnitude direction but of a greater magnitude in the first magnitude direction. The processing amplifier is further capable of providing at the output region a signal in a second magnitude direction substantially similar to a signal provided at the first input region in the first magnitude direction but of a greater magnitude in the second magnitude direction. The first input impedance circuit is coupled between the first coupling regions and the first input region. The second input impedance is coupled between the second coupling region and the second input region. The first feedback impedance circuit is coupled between the output region and the first input region. The second feedback impedance circuit is coupled between the output region and the second coupling region. The first shunting impedance circuit is coupled between the first coupling region and a reference voltage terminal region. The second shunting impedance circuit is coupled between the second input region and the reference voltage terminal region.

19 Claims, 1 Drawing Sheet

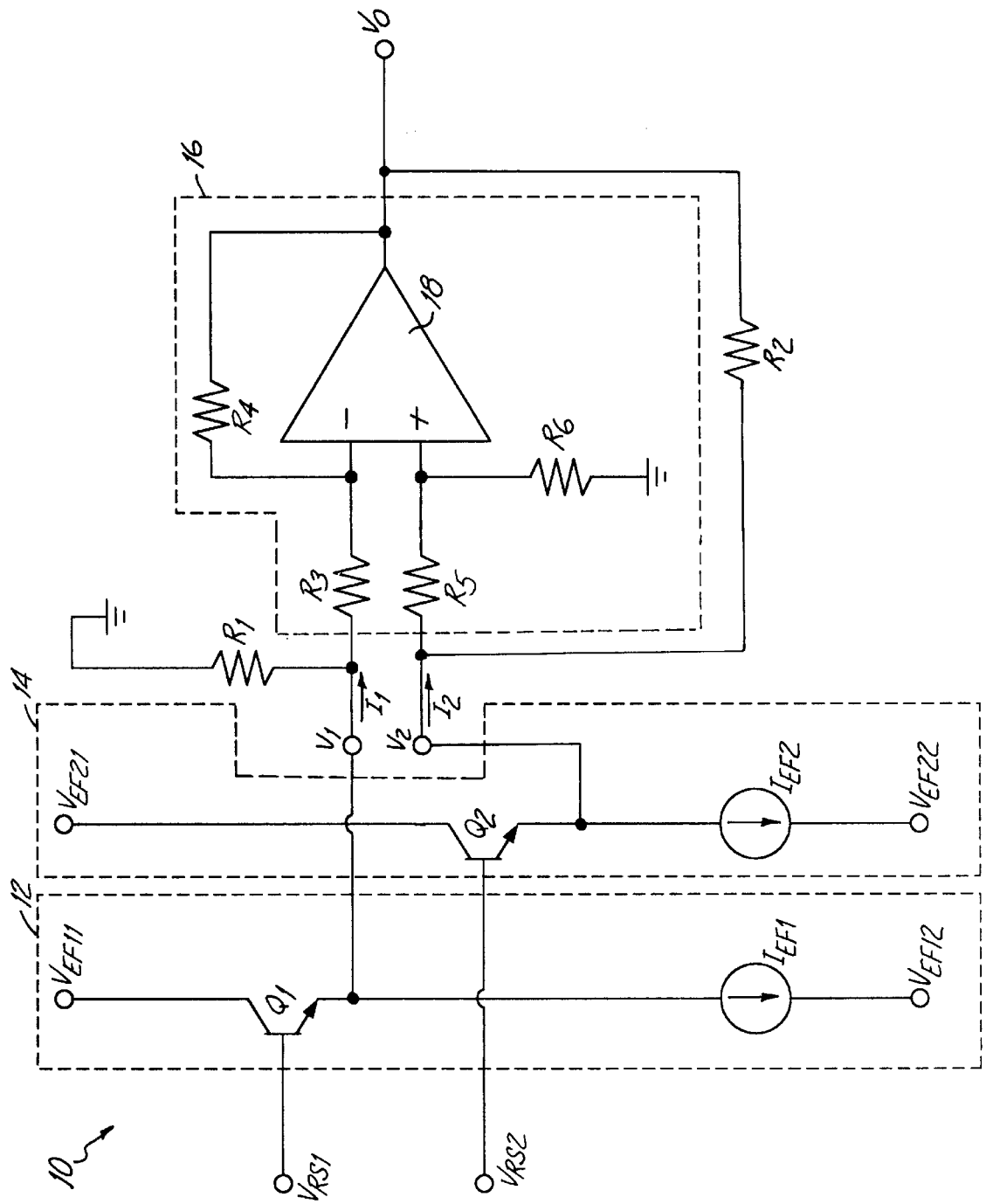

METHOD TO EQUALIZE INPUT CURRENTS TO DIFFERENTIAL-TO-SINGLE-ENDED AMPLIFIER CONFIGURATION

This application claims benefit of Provisional appl. 60/080,872 filed Apr. 6, 1998.

BACKGROUND OF THE INVENTION

The present invention relates to magnetic data storage and retrieval systems and, more particularly, to such systems in which a magnetoresistive sensor is used in the retrieval of magnetically stored data.

Magnetic data storage systems are used to store data in a moving magnetic media layer provided on a moving disk through use of an electrical current-to-magnetic field transducer, or "write head", positioned immediately adjacent thereto. The data is stored, or "written", to the magnetic media by switching the direction of flow of a substantially constant magnitude write current which is established in conductive windings in the write head. Each write current direction transition results in a reversal of the magnetization direction in that portion of the magnetic media just passing by the write head during the flow established in the new direction with respect to the magnetization direction in the media induced by the previous flow in the opposite direction.

Magnetic data retrieval systems are used to recover data previously written to a magnetic media through use of a magnetic field-to-electrical voltage transducer, or "read head". The read head is positioned to have the magnetic media containing previously-written data pass closely thereby such that flux reversal regions in that media create time-varying magnetic fields that can be sensed to provide corresponding output signals. Magnetoresistive (MR) sensors are advantageously used by the read head for this purpose since the resistivity of an MR sensor positioned near the magnetic media fluctuates in response to magnetic fields emanating from the rotating magnetic disk. These changes in resistivity of the MR sensor are easily converted into a usable output voltage signal by establishing a current through the MR sensor.

Typically, a differential amplifier is used as a bias monitoring amplifier for monitoring bias voltage across the MR sensor and temperature. First and second input-follower circuits are often used as buffers between the MR sensor and the differential amplifier to limit the effects of the impedance of one on the other. In bipolar transistor based follower circuits (i.e., emitter-follower circuits), the first and second emitter-follower circuits generally each include both a bipolar transistor and a means for supplying current through that transistor. The bipolar transistors in the first and second emitter-follower circuits each generally have a base connected to a corresponding one of the first and second sides of the MR sensor and a collector connected to a source of voltage. The transistor emitters are connected to a corresponding one of the first and second inputs of the differential amplifier and through a corresponding load impedance to another source of voltage.

Although first and second emitter-follower circuits work well in buffering the MR sensor from the differential amplifier, they each have a corresponding small, but not zero, output impedance that results in a differential error in the output voltage of the differential amplifier when first and second input currents into respective first and second inputs of the differential amplifier are unequal. The unequal first and second input currents correspond to unequal output voltages at the outputs of the respective first and second emitter-follower circuits, thereby causing the voltage difference error between first and second inputs of the differential amplifier.

In some prior art applications, a feedback loop around the emitter-follower circuits has been used to equalize the emitter-follower transistor collector currents, and to correspondingly equalize the amplifier first and second input currents. Such a feedback loop monitors the currents through the first and second emitter-follower circuits as indicators of the circuit output voltages, and provides voltage indications of those currents to the inputs of a differential amplifier. A current that depends upon the voltage difference at the inputs to the differential amplifier is provided at the output of the appropriate one of the first and second emitter-follower circuits to effectively cause the first amplifier input current to substantially equal the second amplifier input current. Although such feedback loops can be effective, they require a relatively large number of circuit components (and so a large amount of die area) to implement and a relatively large amount of power to operate. There is, therefore, a need for read sensor buffers and a signal amplifier combination requiring fewer circuit components than prior art buffers and amplifiers to equalize the first and the second amplifier input currents.

BRIEF SUMMARY OF THE INVENTION

The present invention is a dual-input-to-single-output amplifier circuit. The dual-input-to-single-output amplifier circuit has a processing amplifier, first and second coupling regions, a first input impedance circuit, a second input impedance circuit, a first feedback impedance circuit, and a second feedback impedance circuit, a first shunting impedance circuit, and a second shunting impedance circuit. The processing amplifier is typically an operational amplifier having an inverting input region, a noninverting input region, and an output region. The first and second coupling regions are each suited for coupling to a corresponding one of a first and a second voltage input region.

Each of the impedance circuits are typically resistors. The first input impedance circuit is coupled between the first coupling region and the inverting input region. The second input impedance circuit is coupled between the second coupling region and the noninverting input region. The first feedback impedance circuit is coupled between the output region and the inverting input region. The second feedback impedance circuit is coupled between the output region and the noninverting input region. The first shunting impedance circuit is coupled between the first coupling region and a reference voltage terminal region. The second shunting impedance circuit is coupled between the noninverting input region and the reference voltage terminal region.

The dual-input-to-single-output amplifier circuit may also include current providing means for providing a first current at the first coupling region and a second current at the second coupling region. In one embodiment of the present invention, each of the resistors are selected so as to result in the first input current substantially equaling the second input current.

BRIEF DESCRIPTION OF THE DRAWINGS

The sole FIGURE is an electrical circuit schematic illustrating a read sensor signal amplifier circuit embodying the present invention.

DETAILED DESCRIPTION OF THE PREFERRED EMBODIMENTS

The sole FIGURE is an electrical circuit schematic illustrating read sensor bias monitoring amplifier circuit 10.

Read sensor bias monitoring amplifier circuit 10 includes first and second read sensor coupling contacts $V_{RS1}$ and $V_{RS2}$, first and second emitter-follower circuits 12 and 14, and a signal amplifier having inputs $V_1$ and $V_2$ and an output $V_O$ between which is connected a differential amplifier circuit 16 and first and second resistors $R_1$ and $R_2$. First and second read sensor coupling contacts $V_{RS1}$ and $V_{RS2}$ are each suited for coupling to a corresponding one of opposite ends of a read sensor (not shown in the FIGURE) of a magnetic data storage and retrieval system. The read sensor is typically a magnetoresistive sensor that is generally incorporated within a read sensor circuit which provides biasing for the read sensor. First and second emitter-follower circuits 12 and 14 buffer the read sensor circuit from differential amplifier circuit 16 by introducing a high input impedance to reduce the amount of current drawn away from the read sensor circuit by the signal amplifier.

First emitter-follower circuit 12 has first voltage supply terminal $V_{EF11}$, second voltage supply terminal $V_{EF12}$, NPN bipolar junction transistor $Q_1$, and current sink $I_{EF1}$. First and second voltage supply terminals $V_{EF11}$ and $V_{EF12}$ are suited for electrical connection across a source of constant polarity and substantially constant magnitude voltage having a relatively positive value on first voltage supply terminals $V_{EF11}$. Transistor $Q_1$ has a collector connected to first voltage supply terminal $V_{EF11}$, an emitter connected to current sink $I_{EF1}$ and to signal amplifier input $V_1$, and a base connected to first read sensor contact $V_{RS1}$. Current sink $I_{EF1}$, which is connected between the emitter of transistor $Q_1$ and second voltage supply terminal $V_{EF12}$, nominally draws a substantially constant magnitude current through first emitter-follower circuit 12.

Second emitter-follower circuit 14 has first voltage supply terminal $V_{EF21}$, second voltage supply terminal $V_{EF22}$, NPN bipolar junction transistor $Q_2$, and current sink $I_{EF2}$. First and second voltage supply terminals $V_{EF21}$ and $V_{EF22}$ are suited for electrical connection across a source of constant polarity and substantially constant magnitude voltage having a relatively positive value on first voltage supply terminal $V_{EF21}$. Transistor $Q_2$ has a collector connected to first voltage supply terminal $V_{EF21}$, an emitter connected to current sink $I_{EF2}$ and to signal amplifier input $V_2$, and a base connected to second read sensor contact $V_{RS2}$. Current sink $I_{EF2}$, which is connected between the emitter of transistor $Q_2$ and second voltage supply terminal $V_{EF22}$, nominally draws a substantially constant magnitude current through second emitter-follower circuit 14.

In alternate embodiments of the present invention, other circuits having a high-input impedance, a low output impedance, and a capability to provide the needed input current to the subsequent signal amplifier circuit(such as a source follower circuit) may be used in place of either emitter-follower circuit 12 or 14. Some alternatives, however, may have some effect on performance.

Differential amplifier circuit 16 includes first and second input terminals that are the same as the signal amplifier input terminals $V_1$ and $V_2$, operational amplifier 18, resistors $R_3$, $R_4$, $R_5$, and $R_6$, and an output terminal that is the same as the signal amplifier output terminal $V_O$.

Operational amplifier 18 has an inverting input terminal marked with a minus sign, a noninverting input terminal marked with a plus sign, and an output terminal that is the same as signal amplifier output terminal $V_O$. Resistor $R_3$ is connected between signal amplifier input terminal $V_1$ and the inverting input terminal of operation amplifier 18. Resistor $R_4$ is connected between the inverting input terminal of operation amplifier 18 and output $V_O$. Resistor $R_5$ is connected between signal amplifier input terminal $V_2$ and the noninverting input terminal of operational amplifier 18. Resistor $R_6$ is connected between the noninverting input terminal of operational amplifier 18 and ground.

Differential amplifier circuit 16 is typically a low-cutoff frequency amplifier circuit that provides an indication of both temperature and bias voltage across the MR read sensor. Differential amplifier circuit 16 is designed to provide an output signal at output terminal $V_O$ representing an amplification of the voltage difference between first and second input terminals. The voltage difference is amplified by a gain factor "n" of a selected value. As is well known in the art of amplifier design, the output signal at output terminal $V_O$ will, in the absence of resistors $R_1$ and $R_2$, substantially equal the voltage difference between first and second input terminals $V_1$ and $V_2$ multiplied by gain factor "n" if resistor $R_5$ has a resistance substantially equal to the resistance of resistor $R_3$, if resistors $R_4$ and $R_6$ each have resistances substantially equal to the resistance of resistor $R_3$ multiplied by gain factor "n", and if operational amplifier 18 has a relatively very large gain. Particular preferred values for the gain factor "n" are specific to the application in which the differential amplifier is used. For instance, the gain factor "n" in a differential amplifier for amplifying bias voltage across a MR read sensor in a magnetic data storage and retrieval system is preferably in the range of from about 2 to about 10, and more preferably in the range of from about 4 to about 5. This range in gain factor "n" provides an overall gain for the signal amplifier, for the values of $R_1$ and $R_2$ given below, that produces output signals at the output terminal that are in a desirable range of voltages.

Preferably, the voltage difference between first and second input terminals $V_1$ and $V_2$ substantially equals the voltage difference between first and second read sensor coupling contacts $V_{RS1}$ and $V_{RS2}$, thereby allowing for the voltage signal provided at output terminal $V_O$ to represent an amplification of the voltage bias between first and second read sensor coupling contacts $V_{RS1}$ and $V_{RS2}$. If, however, the effective output impedance of first emitter-follower circuit 12 does not substantially equal the effective output impedance of second emitter-follower circuit 14, the voltage difference between first and second input terminals $V_1$ and $V_2$ will not equal the bias voltage difference between first and second read sensor coupling contacts $V_{RS1}$ and $V_{RS2}$. This error in voltages at first and second input terminals $V_1$ and $V_2$ relative to first and second coupling contacts $V_{RS1}$ and $V_{RS2}$ corresponds to the voltage drop between the base and the emitter of transistor $Q_1$ differing from the voltage drop between the base and the emitter of transistor $Q_2$.

The effective output impedance of first and second emitter-follower circuits 12 and 14 is related to the amount of current drawn through the emitters of corresponding first and second transistors $Q_1$ and $Q_2$. Accordingly, if the amount of current drawn through the emitter of transistor $Q_1$ substantially equals the amount of current drawn through emitter of transistor $Q_2$, the effective output impedance of transistor $Q_1$ will substantially equal the output impedance of transistor $Q_2$. It is therefore preferred that first emitter-follower circuit 12 be closely matched to second emitter-follower circuit 14; that is, that the parameters of transistor $Q_1$ closely match the parameters of transistor $Q_2$, and that current sinks $I_{EF1}$ and $I_{EF2}$ each draw substantially similar amounts of current through corresponding first and second emitter-follower circuits 12 and 14. The close matching of first and second emitter-follower circuits 12 and 14, however, will not, in itself, ensure that the amount of current drawn through the emitter of transistor $Q_1$ is equal to the amount of current drawn through the emitter of transistor $Q_2$ since some of the currents through the emitters of transistors $Q_1$ and $Q_2$ enters the signal amplifier at first and second inputs $V_1$ and $V_2$ as respective first and second input currents $I_1$ and $I_2$.

The present invention is directed toward replacing the feedback loop about the emitter-follower circuits in bias monitoring amplifier circuits of the prior art, as described above, with only two resistors in the signal amplifier, that is, with resistors $R_1$ and $R_2$. Resistor $R_1$ is coupled between first input terminal $V_1$ and ground, while resistor $R_2$ is coupled between second input terminal $V_2$ and output terminal $V_0$. Resistors $R_1$ and $R_2$ have resistances selected to result in substantially equalizing first and second input currents $I_1$ and $I_2$. A good choice has been found to be having the resistance of resistor $R_1$ substantially equal the resistance of resistor $R_2$, and more preferably, the impedance of both resistors $R_1$ and $R_2$ equal the resistance of resistor $R3$ of differential amplifier circuit 16 multiplied by one less that the gain factor "n" of differential amplifier circuit 16, or "n-1".

The present invention is applicable to other amplifier designs in which a signal at the output of the amplifier represents an amplified voltage difference between dual inputs having non-zero output impedances.

Although the present invention has been described with reference to preferred embodiments, workers skilled in the art will recognize that changes may be made in form and detail without departing from the spirit and scope of the invention.

What is claimed is:

1. A dual-input-to-single-output amplifier circuit comprising:
    a processing amplifier having a first input region and a second input region, each of which exhibits a relatively high circuit impedance, and having an output region which exhibits a relatively low circuit impedance, the processing amplifier being capable of providing at the output region a signal in a first magnitude direction substantially similar to a signal provided at the second input region in the first magnitude direction but of a greater magnitude in the first magnitude direction, and the processing amplifier being further capable of providing at the output region a signal in a second magnitude direction substantially similar to a signal provided at the first input region in the first magnitude direction but of a greater magnitude in the second magnitude direction;
    first and second coupling regions each suited for coupling to a corresponding one of first and second voltage input regions;
    a first input impedance circuit coupled between the first coupling region and the first input region;
    a second input impedance circuit coupled between the second coupling region and the second input region;
    a first feedback impedance circuit coupled between the output region and the first input region;
    a second feedback impedance circuit coupled between the output region and the second coupling region;
    a first shunting impedance circuit coupled between the first coupling region and a reference voltage terminal region; and
    a second shunting impedance circuit coupled between the second input region and the reference voltage terminal region.

2. The dual-input-to-single-output amplifier circuit of claim 1 wherein the processing amplifier is an operational amplifier having an inverting input region as the first input region and a noninverting input region as the second input region.

3. The dual-input-to-single-output amplifier circuit of claim 1 wherein the first feedback impedance circuit is a first resistor, the second feedback impedance circuit is a second resistor, the first input impedance circuit is a third resistor, the second input impedance circuit is a fourth resistor, the first shunting impedance circuit is a fifth resistor, and the second shunting impedance circuit is a sixth resistor.

4. The dual-input-to-single-output amplifier circuit of claim 1 wherein the circuit impedance of the first shunting impedance circuit is substantially equal to the circuit impedance of the second feedback impedance circuit.

5. The dual-input-to-single-output amplifier circuit of claim 1 wherein the circuit impedance of the first input impedance circuit substantially equals the circuit impedance of the second input impedance circuit, wherein the circuit impedance of the first feedback impedance circuit and the circuit impedance of the second shunting impedance circuit each substantially equal the circuit impedance of the first input impedance circuit multiplied by a gain factor, and wherein the circuit impedance of the first shunting impedance circuit and the circuit impedance of the second feedback impedance circuit each substantially equal the circuit impedance of the first input impedance circuit multiplied by one less than the gain factor.

6. The dual-input-to-single-output amplifier circuit of claim 1 and further comprising:
    first current providing means for providing a first current at the first coupling region; and
    second current providing means for providing a second current at the second coupling region.

7. The dual-input-to-single-output amplifier circuit of claim 6 wherein the circuit impedance of the first input impedance circuit substantially equals the circuit impedance of the second input impedance circuit, and wherein the circuit impedance of the first feedback impedance circuit and the circuit impedance of the second shunting impedance circuit each substantially equal the circuit impedance of the first input impedance circuit multiplied by a gain factor.

8. The dual-input-to-single-output amplifier circuit of claim 7 wherein the first shunting impedance circuit and the second feedback impedance circuit have circuit impedances which result in the first current being substantially equal to the second current.

9. The dual-input-to-single-output amplifier circuit of claim 8 wherein the circuit impedance of the first shunting impedance circuit is substantially equal to the circuit impedance of the second feedback impedance circuit.

10. The dual-input-to-single-output amplifier circuit of claim 8 wherein the circuit impedance of the first shunting impedance circuit and the circuit impedance of the second feedback impedance circuit each substantially equal the circuit impedance of the first input impedance circuit multiplied by one less than the gain factor.

11. A bias monitoring amplifier circuit for amplifying signals representing voltage differences between opposite ends of a read sensor in a magnetic data storage and retrieval system, the read sensor signal amplifier comprising:
    a processing amplifier having a first input region and a second input region, each of which exhibits a relatively high circuit impedance, and having an output region which exhibits a relatively low circuit impedance, the processing amplifier being capable of providing at the output region a signal in a first magnitude direction substantially similar to a signal provided at the second input region in the first magnitude direction but of a greater magnitude in the first magnitude direction, and the processing amplifier being further capable of providing at the output region a signal in a second magnitude direction substantially similar to a signal provided at the first input region in the first magnitude direction but of a greater magnitude in the second magnitude direction;

first and second coupling regions, each suited for coupling to a corresponding one of the opposite ends of the read sensor;

a first impedance circuit coupled between the first coupling region and the first input region;

a second impedance circuit coupled between the output region and the first input region;

a third impedance circuit coupled between the second coupling region and the second input region;

a fourth impedance circuit coupled between the second input region and a reference voltage terminal region;

a fifth impedance circuit coupled between the first coupling region and the reference voltage terminal region; and a sixth impedance circuit coupled between the output region and the second coupling region.

12. The bias monitoring amplifier circuit of claim 11 wherein the processing amplifier is an operational amplifier having an inverting input region as the first input region and a noninverting input region as the second input region.

13. The bias monitoring amplifier circuit of claim 11 wherein the first impedance circuit is a first resistor, the second impedance circuit is a second resistor, the third impedance circuit is a third resistor, the fourth impedance circuit is a fourth resistor, the fifth impedance circuit is a fifth resistor, and the sixth impedance circuit is a sixth resistor.

14. The bias monitoring amplifier circuit of claim 11 wherein the circuit impedance of the first impedance circuit substantially equals the circuit impedance of the third impedance circuit, and wherein the circuit impedance of the second impedance circuit and the circuit impedance of the fourth impedance circuit each substantially equal the circuit impedance of the first impedance circuit multiplied by a gain factor.

15. The bias monitoring amplifier circuit of claim 14 wherein the circuit impedance of the fifth impedance circuit is substantially equal to the circuit impedance of the sixth impedance circuit.

16. The bias monitoring amplifier circuit of claim 14 wherein the circuit impedance of the fifth impedance circuit and the circuit impedance of the sixth impedance circuit each substantially equal the circuit impedance of the first impedance circuit multiplied by one less than the gain factor.

17. The bias monitoring amplifier circuit of claim 11 further comprising:

a first current providing means for providing a first current at the first coupling region; and a second current providing means for providing a second current at the second coupling region.

18. The bias monitoring amplifier circuit of claim 17 wherein the first, the second, the third, the fourth, the fifth, and the sixth impedance circuits have circuit impedances which result in the first current substantially equaling the second current and in an output signal at the output region that represents the voltage difference between the first and the second coupling regions multiplied by a gain factor.

19. The bias monitoring amplifier circuit of claim 18 wherein the circuit impedance of the first impedance circuit substantially equals the circuit impedance of the third impedance circuit, wherein the circuit impedance of the second impedance circuit and the circuit impedance of the fourth impedance circuit each substantially equal the circuit impedance of the first impedance circuit multiplied by the gain factor, and wherein the circuit impedance of the fifth impedance circuit and the circuit impedance of the sixth impedance circuit each substantially equal the circuit impedance of the first impedance circuit multiplied by one less than the gain factor.

* * * * *